United States Patent
Van Der Sijs et al.

(10) Patent No.: US 7,388,652 B2
(45) Date of Patent: Jun. 17, 2008

(54) WAVE FRONT SENSOR WITH GREY FILTER AND LITHOGRAPHIC APPARATUS COMPRISING SAME

(75) Inventors: Arie Johan Van Der Sijs, Veldhoven (NL); Haico Victor Kok, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/453,247

(22) Filed: Jun. 15, 2006

(65) Prior Publication Data

US 2007/0291245 A1    Dec. 20, 2007

(51) Int. Cl.
 G03B 27/54    (2006.01)
 G03B 27/68    (2006.01)
 G03B 27/42    (2006.01)
(52) U.S. Cl. ............................. 355/67; 355/52; 355/53
(58) Field of Classification Search ................. 355/67, 355/52, 53; 356/364, 630
See application file for complete search history.

(56) References Cited

U.S. PATENT DOCUMENTS

| | | | |
|---|---|---|---|
| 4,979,042 A | 12/1990 | Vogel | |
| 2002/0105627 A1* | 8/2002 | Matsuyama | ................... 355/52 |
| 2004/0165165 A1* | 8/2004 | Yun et al. | ..................... 355/53 |
| 2005/0018312 A1 | 1/2005 | Gruner at al. | |
| 2006/0181690 A1* | 8/2006 | Nishinaga et al. | ............ 355/53 |

FOREIGN PATENT DOCUMENTS

| | | |
|---|---|---|
| DE | 101 30 175 A1 | 1/2003 |
| EP | 0 252 159 A1 | 1/1988 |
| EP | 1 510 870 A1 | 3/2005 |
| JP | 07-270235 | 10/1995 |
| JP | 9-187993 | * 7/1997 |

OTHER PUBLICATIONS

European Search Report issued for European Patent Application No. 07109648.1-1226, dated Nov. 2, 2007.
Nelson, R.G., "Automatic Thresholding and Shading Circuit for Solid-State Cameras and Scanners," IBM Technical Disclosure Bulletin, vol. 17, No. 2, Jul. 1974, pp. 519-520.

* cited by examiner

*Primary Examiner*—Peter B Kim
(74) *Attorney, Agent, or Firm*—Pillsbury Winthrop Shaw Pittman, LLP

(57) ABSTRACT

A radiation distribution measurement system for measuring a phase distribution of a beam of radiation and/or a pupil distribution of a projection system includes a transparent carrier plate, a grating and/or a pinhole configured at a first side of the transparent carrier plate, and a camera at an opposite side of the transparent carrier plate. The measurement system also includes a radiation filter between the transparent carrier plate and the camera, with a transmissivity that is lowest at the center of the filter and gradually and concentrically increases towards the outside of the filter. By placing the filter with its specific transmissivity, the difference in intensity across the wave front sensor 10 (i.e. the gradient in intensity) is compensated. The intensity of the light incident on the camera is made more uniform resulting in an improved performance of the measurement system.

18 Claims, 4 Drawing Sheets

WAVE FRONT SENSOR WITH GREY FILTER AND LITHOGRAPHIC APPARATUS COMPRISING SAME

BACKGROUND OF THE INVENTION

1. Field of the Invention

The present invention relates to radiation distribution measurement systems for measuring a phase distribution of a beam of radiation and/or a pupil distribution of a projection system.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Advanced optical systems for low $k_1$ lithography require accurate characterization of various imaging parameters to insure that Optical Proximity Correction strategies (OPC) can be maintained. Among these parameters, lens aberrations and illumination profiles are optical column characteristics to be considered. A phase measurement interferometer may be integrated into lithographic projection tools to measure and control tool performance parameters. The primary functionality of such a measurement system is to measure and analyze wave front aberrations across the full image field with high accuracy and speed. In addition to the acquisition of wave front aberrations in terms of Zernike polynomials, detailed measurements of high resolution wave fronts are possible.

In order to measure aberrations of a projection system of a lithographic apparatus, a phase measurement interferometer may be placed on or near the substrate table of the lithographic apparatus. Such an integrated phase measurement interferometer may be based on lateral shearing interferometry using a diffraction grating in front of a camera.

Besides the projection system properties, the detailed shape of the illumination pupil distribution and transmission of the projection system (apodisation) are considered for system operation. The pupil distribution and apodisation can be measured by a sensor that very closely resembles the phase measurement interferometer mentioned above. However, in this case a diffraction grating is not present and is replaced by a small aperture (pinhole) either on the sensor or on the reticle. Of course the sensor is in that case not an interferometer. Below, the term 'radiation distribution measurement system' is used as comprising both the phase measurement interferometer and the pupil distribution sensor. The diffraction grating and the pinhole can be integrated in the same sensor by placing the diffraction grating on one portion of the sensor and the pinhole on another portion of the sensor.

Current phase measurement interferometers are configured to measure a light intensity distribution. This light intensity distribution is generated by laser light which is diffracted by a grating structure and subsequently converted to the visible part of the spectrum by means of a conversion layer in front of the sensor. The conversion layer is not always necessary like when, for example, a DUV (deep ultra violet) sensitive camera is used. The grating is replaced by a pinhole so as to measure a pupil distribution. From these intensity measurements, information is retrieved on the aberrations of the projection system (by the interferometer) and on the shape and intensity of the illumination pupil (by the pupil distribution sensor). The light intensity distribution can be measured using a CMOS camera or a CCD camera, or any other camera comprising a plurality of camera pixels.

The light distribution on the camera typically has a maximum intensity near the center of the image of the pupil and a decreasing intensity towards the edge of the image of the pupil. The reason for this is that at the edge of the pupil the light is incident on the camera under a large angle, spreading the light over more pixels than at the center of the pupil.

This non-uniform intensity distribution in combination with the limited dynamic range of typical camera's gives an unwanted degradation of the signal to noise ratio (S/N) towards the edge of the pupil of the projection system.

SUMMARY OF THE INVENTION

It is desirable to improve the dynamic range of a radiation distribution measurement system used for measuring aberrations of a projection system and/or pupil distributions of the lens while maintaining a satisfactory S/N ratio.

According to an embodiment of the invention, a radiation distribution measurement system is provided that is configured to measure a phase distribution of a beam of radiation and/or a pupil distribution of a projection system. The measurement system comprises a transparent carrier plate; at least one of a grating and a pinhole configured at a first side of the transparent carrier plate; a camera configured at a second side opposite the first side of the transparent carrier plate, wherein the measurement system also comprises a radiation filter configured between the transparent carrier plate and the camera, the radiation filter having a transmissivity that is lowest at the center of the filter and gradually and concentrically increases towards the outside of the filter.

According to another embodiment of the invention, there is provided a lithographic apparatus comprising an illumination system configured to condition a radiation beam; a support configured to support a patterning device, the patterning device being configured to impart the radiation beam with a pattern in its cross-section to form a patterned radiation beam; a substrate table configured to hold a substrate; and a projection system configured to project the patterned radiation beam onto a target portion of the substrate, wherein the apparatus comprises a radiation distribution measurement system as described above.

According to another embodiment of the invention, there is provided a method of measuring a phase distribution of a beam of radiation and/or a pupil distribution of a projection system, the method comprising providing a transparent carrier plate; configuring a grating and/or a pinhole at a first side of the transparent carrier plate; configuring a camera at a second side opposite the first side of the transparent carrier plate; configuring a radiation filter between the transparent carrier plate and the camera, the radiation filter having a transmissivity that is lowest at the center of the filter and gradually and concentrically increases towards the outside of the filter.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
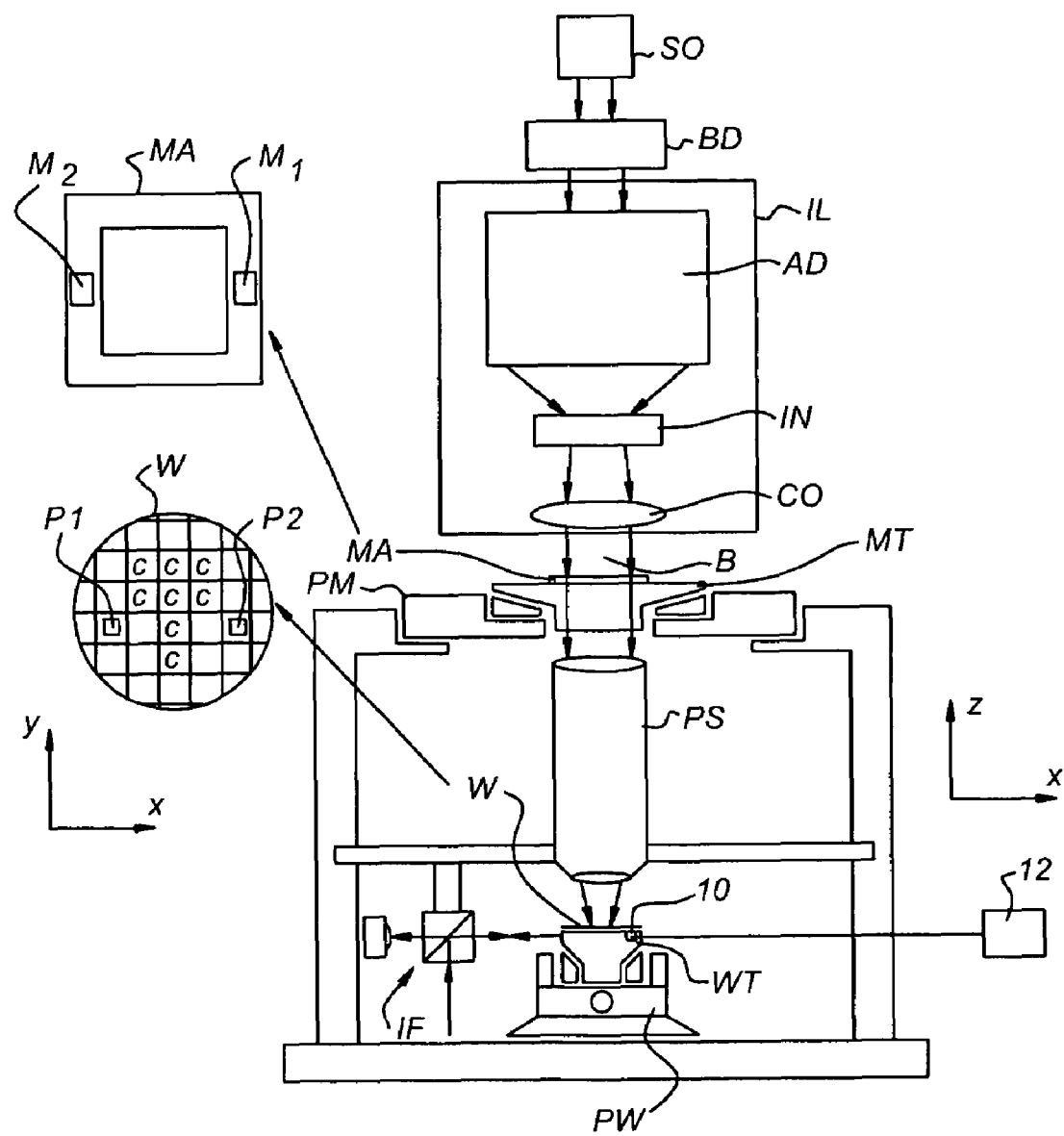
FIG. 1 depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation or DUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:
1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

According to an embodiment, the lithographic apparatus comprises a wave front sensor 10 configured on or near the substrate table WT. The sensor 10 may be used during a measurement phase before exposure of the substrates. The substrate table WT is moved so that the wave front sensor 10 is positioned under the projection system PS. Then, radiation is projected onto the wave front sensor 10. The signals from the sensor are transmitted towards a processor 12. The processor 12 is configured to calculate aberrations of the projection system PS. The calculated aberrations can be used to qualify or adjust the lens.

Figure 2:
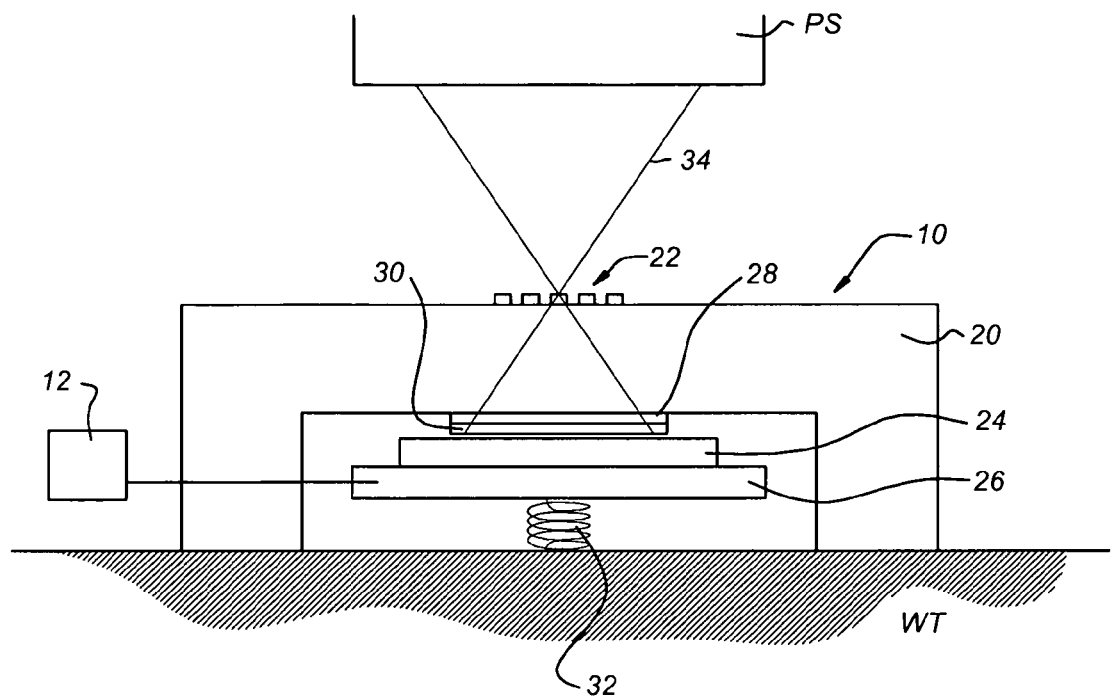
FIG. 2 depicts an embodiment of a wave front sensor.

FIG. 2 schematically shows an embodiment of the wave front sensor 10. The wave front sensor 10 comprises a transparent carrier plate 20, a grating 22 configured at a first side of the transparent carrier plate 20, and a camera 24, 26 configured at an opposite side of the transparent carrier plate 20. The carrier plate 20 may for example comprise fused silica, sapphire or any other suitable material. The grating 22 may comprise a plurality of bars that are not transparent to the radiation involved. In an embodiment the carrier plate 20 is transparent to DUV (157-248 nm). The camera 24, 26 comprises a camera chip 24 configured on a printed circuit board 26. The camera chip 24 comprises a plurality of camera pixels which are sensitive to visual light. The camera chip 24 may be for example a CMOS chip. The wave front sensor 10 further comprises a conversion layer 28 configured between the carrier plate 20 and the camera 24, 26. The conversion layer 28 is configured to convert DUV radiation 34 into visible light. The wave front sensor 10 also comprises a radiation filter 30 configured between the conversion layer 28 and the camera 24, 26. In an embodiment, the wave front sensor 10 comprises a spring 32 configured to press the camera 24, 26 and the radiation filter 30 against the conversion layer 28. In one embodiment, the conversion layer 28 is fixed to the carrier plate 20 (by gluing or another method). In another embodiment, there is an air layer in between the carrier plate 20 and the conversion layer 28, so in this case the conversion layer 28 is not directly fixed to the carrier plate 20.

The radiation filter 30 has a transmissivity that is lowest at the center of the filter and gradually and concentrically increases towards the outside of the filter. Without this radiation filter 30, the intensity of the light measured by a camera pixel would decrease with the distance from the center of the camera 24, 26. This is because this light reaches the sensor under an angle. As a consequence, the signal to noise ratio would differ significantly between central and outer regions of the camera 24, 26. With increasing NA, in particular NA>1 as in immersion systems, the angles of incidence would increase, and hence the impact on the signal to noise ratio differences and sensor performance. By placing the radiation filter 30 with its specific transmissivity, the difference in intensity across the wave front sensor 10 (i.e. the gradient in intensity) is compensated. The intensity of the light incident on the camera chip 24 is made more uniform. This means that camera pixels at the central region of the camera chip 24 and camera pixels at the outer region will receive the same, or at least more equal, intensities. This result can be used to bias the camera 24, 26 and the conversion layer 28 so as to get an optimum S/N ratio for all the pixels without the danger of clipping, and thus an improved performance of the wave front sensor 10.

The radiation filter 30 can directly be configured on top of the camera chip 24, just below the conversion layer 28, see FIG. 2. The radiation filter 30 may also be a DUV filter in which case it could be applied just below the quartz carrier plate 20. The conversion layer 28 may comprise phosphor which is known to convert DUV into visible light. The radiation filter 30 may comprise a transparent plate made of glass, plastics or the like, with a layer of metal, inorganics or their oxides evaporated on the layer.

Figure 3:
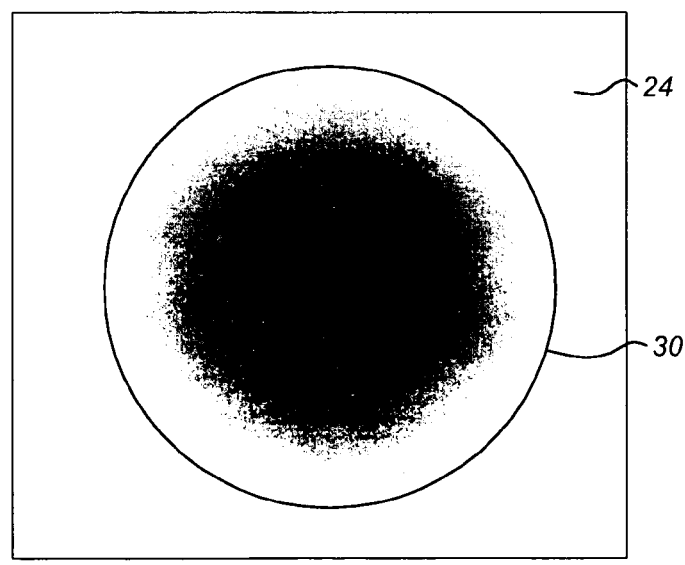
FIG. 3 depicts a top view of the radiation filter and the camera chip.

FIG. 3 shows a top view of the radiation filter 30 and the camera chip 24. A DUV radiation beam 34 coming through the grating 22, see FIG. 2, will be converted into visible light by the conversion layer 28, and will reach the radiation filter 30. The radiation filter 30 will change the distribution of the light intensity before the light reaches the camera chip 24.

Figure 4:
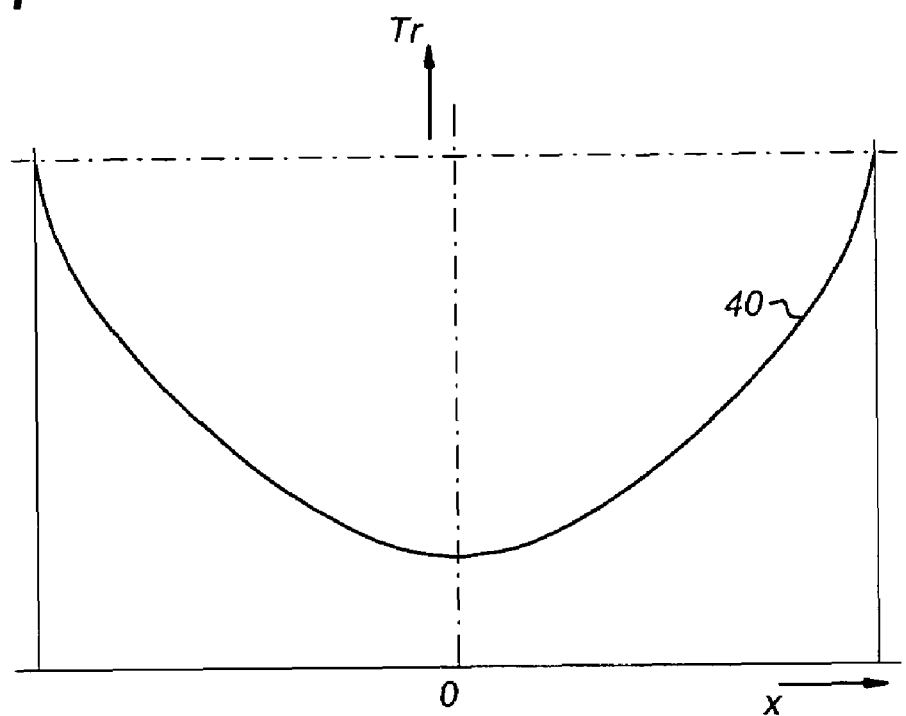
FIG. 4 depicts a transmissivity distribution of the radiation filter as a function of the distance x from the center of the radiation filter, according to an embodiment.
Figure 5:
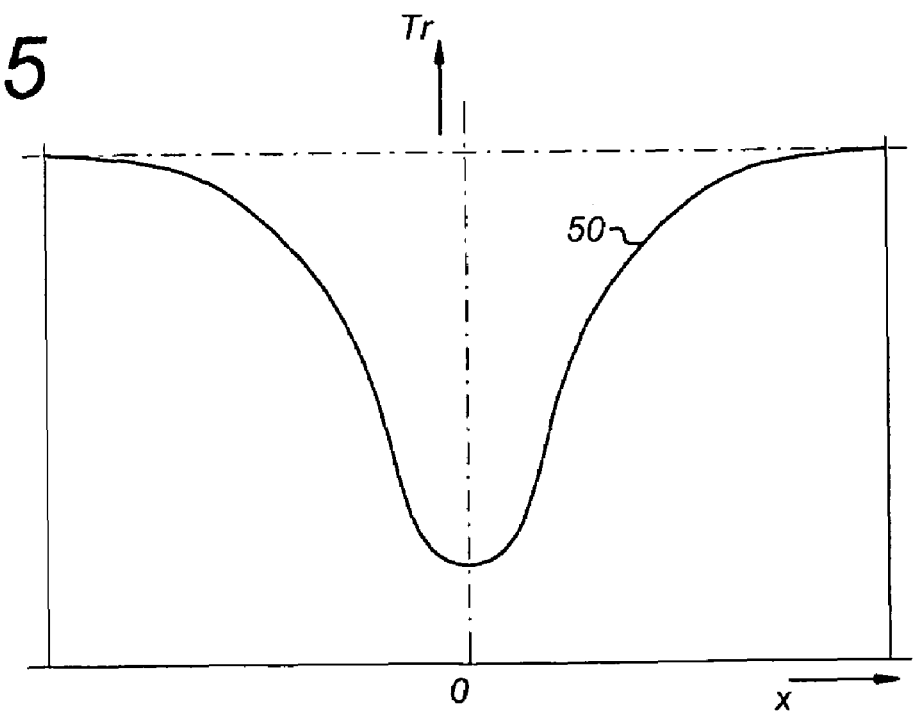
FIG. 5 depicts a transmissivity distribution according to another embodiment in which the distribution is Gaussian shaped.

FIG. 4 shows a transmissivity distribution $T_r$ of the radiation filter 30 as a function of the distance x from the center of the radiation filter, according to an embodiment, see curve 40. As can be seen from the graph, the transmissivity is lowest at the center of the radiation filter and increases towards the outer region of the radiation filter. In FIG. 5, a transmissivity distribution 50 is shown according to another embodiment in which the distribution is Gaussian shaped. It should be appreciated that other shapes are possible, for example non-symmetrical curves. The shape of the transmissivity curve may be chosen depending on the distribution of the radiation incident on the radiation filter 30.

Figure 6:
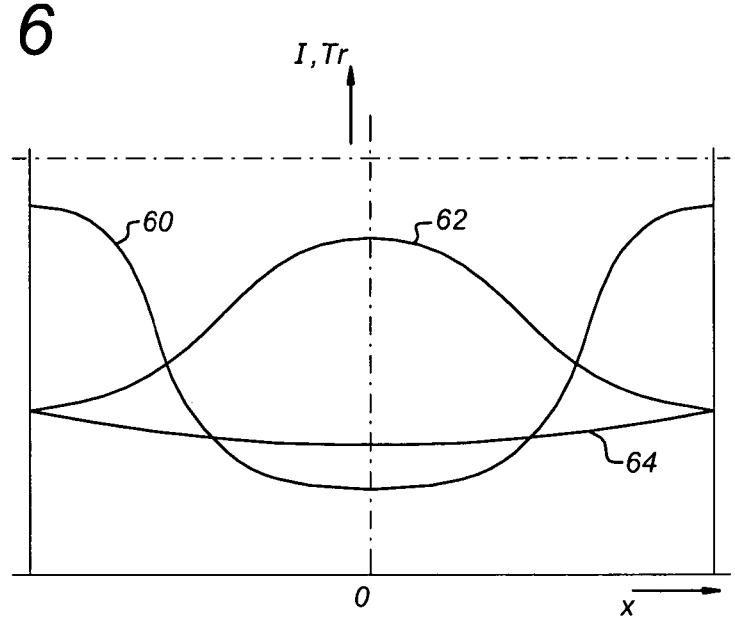
FIG. 6 depicts another embodiment of the distribution of the transmissivity of the radiation filter together with a distribution of the radiation incident on the radiation filter.

FIG. 6 shows another embodiment of the distribution of the transmissivity $T_r$ of the radiation filter 30, see curve 60, together with a distribution I of the radiation incident on the radiation filter, see curve 62. The resulting intensity distribution reaching the camera chip 24 is depicted by curve 64. As can be seen from FIG. 6, curve 64 is not a straight line. In practice, the curve 64 will not be a straight line since it is very difficult to fabricate a radiation filter having an ideal distribution which is an exact inverse function of the intensity distribution of the light reaching the radiation filter 30. It is noted that an exact straight line is not needed for improving the performance of the sensor 10.

Figure 7:
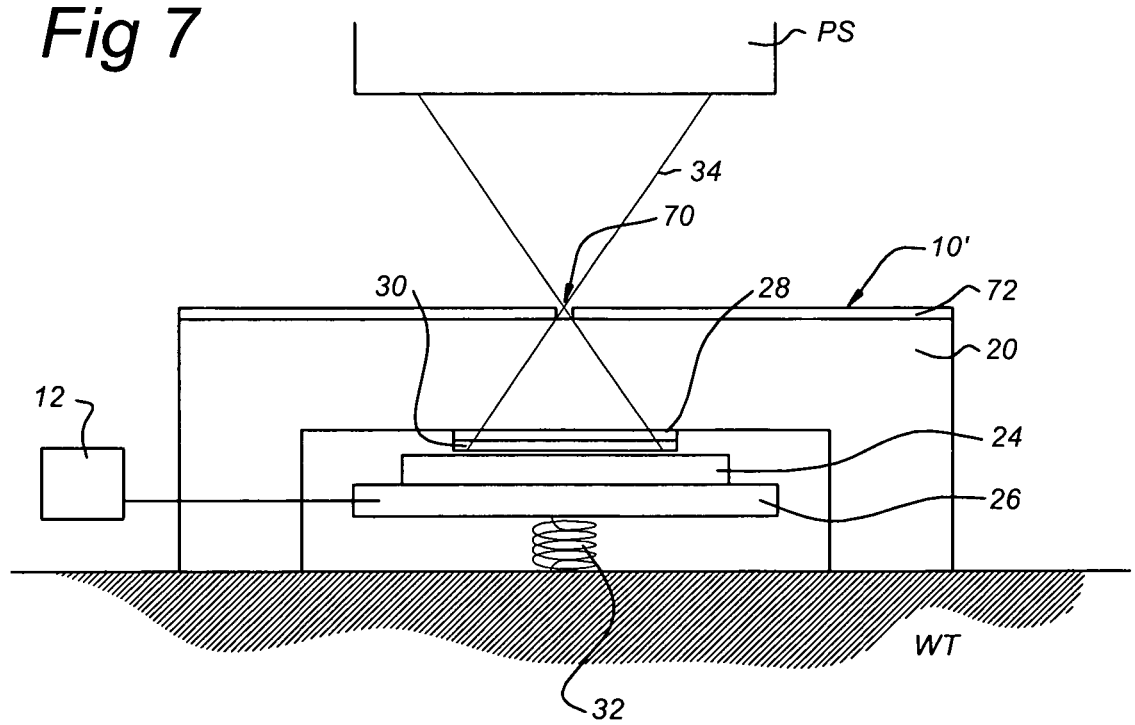
FIG. 7 depicts an embodiment of the pupil distribution sensor.

FIG. 7 shows an embodiment of a pupil distribution sensor 10'. The pupil distribution sensor 10' comprises almost the same components as the wave front sensor 10 described above with reference to FIG. 2. But instead of the grating 22, the pupil distribution sensor 10' comprises a pinhole 70 in a non-transparent layer 72 deposited on top of the carrier plate 20. Radiation coming through the pinhole 70 is detected by the camera 24. By using the pinhole instead of a grating, the pupil distribution of the lithographic apparatus can be determined.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A radiation distribution measurement system configured to measure a phase distribution of a beam of radiation and/or a pupil distribution of a projection system, the measurement system comprising:

a transparent carrier plate;

a grating and/or a pinhole configured at a first side of the transparent carrier plate;

a camera having a sensitive element configured at a second side opposite the first side of the transparent carrier plate; and a radiation filter configured between the transparent carrier plate and the camera, the radiation filter having a transmissivity that is lowest at the center of the filter and gradually and concentrically increases towards the outside of the filter, and the radiation filter is arranged to transmit toward the sensitive element radiation from an optical system having a numerical aperture of about 1 or greater, and to achieve approximately uniform signal to noise ratio for substantially all portions of the sensitive element of the camera.

2. A radiation distribution measurement system according to claim 1, wherein a transmissivity distribution of the radiation filter is Gaussian shaped.

3. A radiation distribution measurement system according to claim 1, further comprising a conversion layer configured to convert DUV radiation into visible light.

4. A radiation distribution measurement system according to claim 3, wherein the conversion layer is configured between the radiation filter and the camera.

5. A radiation distribution measurement system according to claim 3, wherein the conversion layer is configured between the carrier plate and the radiation filter.

6. A radiation distribution measurement system according to claim 1, wherein the camera comprises a CMOS camera chip.

7. A radiation distribution measurement system according to claim 1, wherein the carrier plate is transparent for DUV radiation.

8. A lithographic apparatus, comprising:
an illumination system configured to condition a radiation beam;
a support configured to support a patterning device, the patterning device being configured to impart the radiation beam with a pattern in its cross-section to form a patterned radiation beam;
a substrate table configured to hold a substrate;
a projection system configured to project the patterned radiation beam onto a target portion of the substrate; and
a radiation distribution measurement system configured to measure a phase distribution of the beam of radiation and/or a pupil distribution of the projection system, the measurement system comprising
a transparent carrier plate;
a grating and/or a pinhole configured at a first side of the transparent carrier plate;
a camera having a sensitive element configured at a second side opposite the first side of the transparent carrier plate; and
a radiation filter configured between the transparent carrier plate and the camera, the radiation filter having a transmissivity that is lowest at the center of the filter and gradually and concentrically increases towards the outside of the filter, and the radiation filter is arranged to transmit toward the sensitive element radiation from an optical system having a numerical aperture of about 1 or greater, and to achieve approximately uniform signal to noise ratio for substantially all portions of the sensitive element of the camera.

9. A lithographic apparatus according to claim 8, further comprising an immersion liquid between the projection system and the substrate table.

10. A lithographic apparatus according to claim 8, further comprising a processor configured to receive signals from the radiation distribution measurement system and to determine aberrations of the projection system using the signals.

11. A lithographic apparatus according to claim 8, further comprising a processor configured to receive signals from the radiation distribution measurement system and to determine a pupil distribution of the projection system using the signals.

12. A lithographic apparatus according to claim 8, wherein a transmissivity distribution of the radiation filter is Gaussian shaped.

13. A lithographic apparatus according to claim 8, further comprising a conversion layer configured to convert DUV radiation into visible light.

14. A lithographic apparatus according to claim 13, wherein the conversion layer is configured between the radiation filter and the camera.

15. A lithographic apparatus according to claim 13, wherein the conversion layer is configured between the carrier plate and the radiation filter.

16. A lithographic apparatus according to claim 8, wherein the camera comprises a CMOS camera chip.

17. A lithographic apparatus according to claim 8, wherein the carrier plate is transparent for DUV radiation.

18. A method of measuring a phase distribution of a beam of radiation and/or a pupil distribution of a projection system, the method comprising:
receiving radiation from an optical system having a numerical aperture of about 1 or greater at a grating or a pinhole at a first side of a transparent carrier plate;
receiving radiation from the grating or pinhole at a camera at a second side opposite the first side of the transparent carrier plate; and
transmitting radiation from the grating or pinhole through a radiation filter between the transparent carrier plate and the camera, the radiation filter having a transmissivity that is lowest at the center of the filter and gradually and concentrically increases towards the outside of the filter and the radiation filter is arranged to achieve approximately uniform signal to noise ratio for substantially all portions of a sensitive element of the camera.

* * * * *